United States Patent [19]
Chen

[11] Patent Number: 6,091,104
[45] Date of Patent: Jul. 18, 2000

[54] FLASH MEMORY CELL WITH SELF-ALIGNED GATES AND FABRICATION PROCESS

[76] Inventor: Chiou-Feng Chen, 7573 Bollinger Rd., Cupertino, Calif. 95014

[21] Appl. No.: 09/275,670

[22] Filed: Mar. 24, 1999

[51] Int. Cl.[7] .................................................. H01L 29/788
[52] U.S. Cl. .......................................... 257/326; 257/321
[58] Field of Search ................................ 257/315, 316, 257/326

[56] References Cited

U.S. PATENT DOCUMENTS

| | | |
|---|---|---|
| 4,794,565 | 12/1988 | Wu et al. . |
| 5,029,130 | 7/1991 | Yeh . |
| 5,208,174 | 5/1993 | Mori . |
| 5,284,784 | 2/1994 | Manley . |
| 5,402,371 | 3/1995 | Ono . |
| 5,455,792 | 10/1995 | Yi . |
| 5,500,384 | 3/1996 | Melzner . |
| 5,557,122 | 9/1996 | Shriv . |
| 5,643,812 | 7/1997 | Park . |
| 5,726,471 | 3/1998 | Keller et al. . |
| 5,767,005 | 6/1998 | Doan et al. . |
| 5,780,892 | 7/1998 | Chen . |
| 5,838,039 | 11/1998 | Sato et al. . |
| 5,847,427 | 12/1998 | Hagiwara . |
| 5,847,996 | 12/1998 | Guterman et al. . |
| 5,917,214 | 6/1999 | Sung . |

*Primary Examiner*—David Hardy
*Attorney, Agent, or Firm*—Flehr Hohbach Test Albritton & Herbert LLP

[57] ABSTRACT

Nonvolatile memory cell and process in which a control gate or a thick dielectric film is used as a mask in the formation of a floating gate and also as a step in the formation and alignment of a select gate. The floating gate is relatively thin and has a side wall with a rounded curvature which, in some embodiments, serves as a tunneling window for electrons migrating to the select gate during erase operations. In other embodiments, the gate oxide beneath the floating gate is relatively thin, and the electrons tunnel through the gate oxide to the source region in the substrate below.

7 Claims, 11 Drawing Sheets

FLASH MEMORY CELL WITH SELF-ALIGNED GATES AND FABRICATION PROCESS

This invention pertains generally to semiconductor devices and, more particularly, to a nonvolatile memory device with a self-aligned gates and to a process for fabricating the same.

Nonvolatile memory devices currently in use for retaining stored data during periods when no power is applied include PROM (programmable read only memory), EPROM (electrically programmable read only memory), EEPROM (electrically erasable programmable read only memory), and flash EEPROM devices.

EPROM, EEPROM and flash EEPROM devices have an advantage over PROM devices in that the data stored in them can be erased and rewritten. In EPROM devices, the data is erased by exposure to UV light, and in EEPROM and in flash EEPROM devices, it is erased electrically. Flash EEPROM devices differ from EEPROM devices in that the data can be erased in blocks ranging in size from 128 to 64K bytes, rather than on a byte-by-byte basis.

In general, there are two basic types of nonvolatile memory cell structures: stack-gate and split-gate. The stack-gate memory cell usually has a floating gate and a control gate, with the control gate being positioned directly above the floating gate. In a split-gate cell the control gate is still positioned above the floating gate, but it is offset laterally from it. The fabrication process for a stack-gate cell is generally simpler than that for a split-gate cell. However, a stack-gate cell has an over-erase problem which a split-gate cell does not have. This problem is commonly addressed by maintaining the threshold voltage of the cell in a range of about 1.0–2.0 volts after an erase cycle, which adds complexity to the circuit design.

Although a split-gate memory cell has no over erase problem, it generally includes an additional gate known as a select gate. Such cells are typically fabricated in double-poly or triple-poly processes which involve relatively complex processing steps. In addition, split-gate cells are generally larger than stack-gate cells. Nevertheless, because of the relatively simple circuit design which is possible when there is no over-erase problem, split-gate cells are used widely, particularly in embedded nonvolatile memory applications.

In the manufacture of split-gate memory cells, the floating gate pattern is commonly formed with one photolithographic mask, and the control gate or select gate pattern is then defined with another mask. Examples of this technique are found in U.S. Pat. No. 4,794,565, 5,029,130 and 5,455,792. During formation of the floating gate, corner rounding can occur, and the pattern can shift relative to the active area. Also, limitations in the accuracy and resolution of the photolithographic process can result in misalignment of the floating gate. Similarly, pattern shift of the control gate or select gate relative to the floating gate can also cause alignment problems. In a typical array in which two adjacent memory cells share the same drain or source region, the overall misalignment can cause one cell to have a very short channel length for the floating gate and/or the select gate. The short channel and punchthrough effects may make it difficult or impossible to identify the logic state of the cell clearly. These problems make process control more difficult, and may require the cell array layout to be larger in order to provide tolerance for process variations.

In the erase mode, electrons are forced to migrate away from the floating gate so that it becomes charged with positive ions. This is commonly accomplished by Fowler-Nordheim tunneling in which a tunnel oxide having a thickness on the order of 70–120 Å is formed between the monocrystalline silicon substrate and the floating gate. A relative strong electric field (greater than 10mV/cm) is then applied to the tunnel oxide, and the electrons tunnel from the floating gate toward the underlying source, drain or channel region. This technique is widely used both in stack-gate cells and in split-gate cells, and is described in greater detail in U.S. Pat. No. 5,402,371, 5,284,784 and 5,445,792.

A prior art split-gate sidewall-type EEPROM memory cell 16 which utilizes Fowler-Nordheim tunneling is illustrated in FIG. 1. This cell has a silicon substrate 17, with source and drain regions 18, 19 formed in a channel region 21. A floating gate 22 and a control gate 23 are formed above the channel region, with a gate oxide 24 between the substrate and the floating gate, and a dielectric film 26 between the floating gate and the control gate. A select gate 27 is formed to one side of the floating gate and the control gate, with an oxide layer 28 between it and the substrate, and a dielectric film 29 between it and the other two gates.

In the program mode, control gate 23 is biased at a high positive voltage (e.g., 18 volts), and the source, drain and select gate are biased at 0 volts. This establishes a strong electric field across gate oxide 24, which initiates Fowler-Nordheim tunneling, with electrons migrating from the channel region to the floating gate.

In the erase mode, a positive voltage of about 9 volts is applied to channel region 21, a negative voltage of about −9 volts is applied to the control gate, and the source, drain and select gate are left open. The strong negative electric field thus created across gate oxide 24 initiates Fowler-Nordheim tunneling, with electrons migrating from the floating gate 22 to the channel region beneath the floating gate.

Another popular technique for programming split-gate memory cells is hot carrier injection. This technique is illustrated in FIG. 2 in connection with a split-gate flash EEPROM memory cell of the prior art. This cell differs from the cell of FIG. 1 in that a portion of select gate 31 overhangs control gate 23. The channel includes a region $21a$ beneath the select gate, a region $21b$ beneath the floating gate, and a mid-channel region $21c$ between the select gate and the floating gate.

In the program mode, control gate 23 is biased at a high voltage (e.g., 12 volts), select gate 31 and drain node 19 are biased at about 3 volts, and source node 18 is grounded. With this biasing, most of the drain-to-source voltage is applied to a mid-channel region $21c$ between the select gate and the floating gate, thereby establishing a high electric field in that region. As electrons flow from the source to the drain, some of them are accelerated by the electric field in the mid-channel region and become heated. The floating gate, which is coupled to the control gate, is at a higher voltage level than the voltage in the mid-channel region. This creates a vertical electric field between the floating gate and the channel region. Some of the hot electrons get accelerated by the vertical field, which causes them to overcome the energy barrier of the oxide and be injected into the floating gate.

In the erase mode, control gate 23 is biased at a negative voltage of about −12 volts, drain node 19 is biased at a voltage of about 3 volts, and select gate 31 and source node 18 are grounded. A high voltage is now established across the oxide layer 24 between floating gate 22 and the drain region under the floating gate. That causes electrons to tunnel from the floating gate to the drain region. This technique is disclosed in U.S. Pat. Nos. 5,284,784 and 5,445,792.

A prior art split-gate flash memory cell which has a floating gate 23 and a control gate 32, but no select gate is illustrated in FIG. 3. In this cell, a portion of the control gate crosses over or overhangs the floating gate, channel region 21a is located beneath the control gate, channel region 21b is located beneath the floating gate, and mid-channel region 21c is located between the control gate and the floating gate.

In the program mode, source 18 is biased at a high voltage (e.g., 12 volts), control gate 32 is biased at about 3 volts, and drain 19 is grounded. As in the cell of FIG. 2, hot electrons are generated in mid-channel region 21c and are injected into the floating gate. In this cell, the voltage coupled to the floating gate comes from the source node.

In the erase mode, control gate 32 is biased at a voltage of about 15 volts, source node 18 is biased at 0 volts, and drain node 19 is open. A high voltage is now formed across the inter-poly dielectric 26 between the floating gate and the control gate. The edge 23a of the floating gate serves as a cathode or source of electrons for Fowler-Nordheim tunneling, and electrons migrate from that edge to the control gate. Here again, the voltage coupled to the floating gate comes from the source node.

It is in general an object of the invention to provide a new and improved semiconductor device and process for fabricating the same.

Another object of the invention is to provide a semiconductor device and process of the above character which overcome the limitations and disadvantages of the prior art.

These and other objects are achieved in accordance with the invention by providing a nonvolatile memory cell and process in which a control gate or a thick dielectric film is used as a mask in the formation of a floating gate and also as a step in the formation and alignment of a select gate. The floating gate is relatively thin and has a side wall with a rounded curvature which, in some embodiments, serves as a tunneling window for electrons migrating to the select gate during erase operations. In other embodiments, the gate oxide beneath the floating gate is relatively thin, and the electrons tunnel through the gate oxide to the source region in the substrate below.

Figure 1:
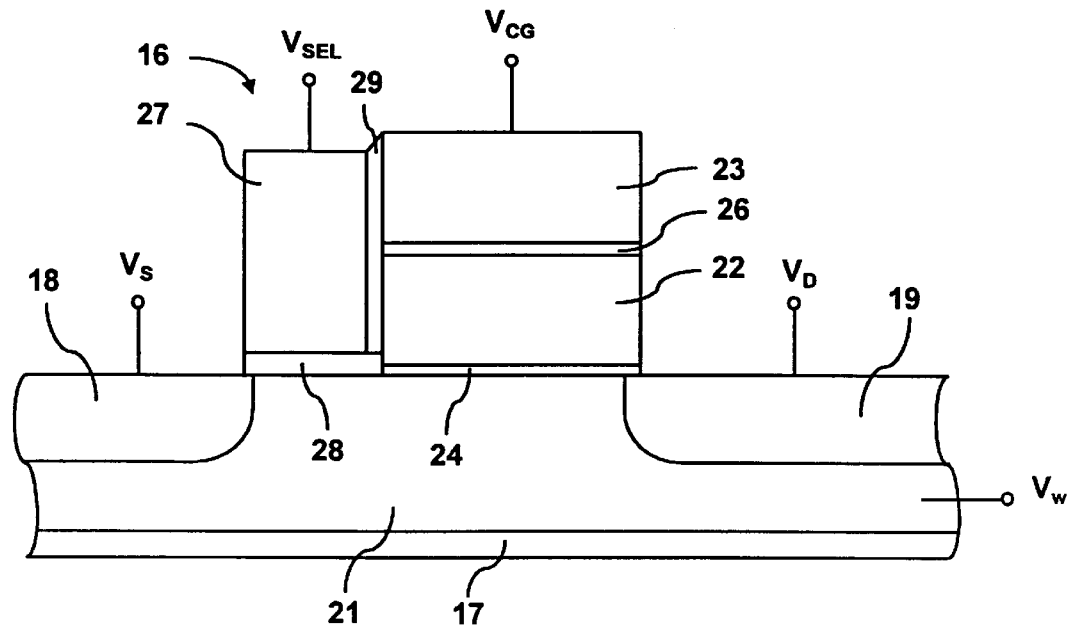
FIG. 1 is a cross sectional view of a sidewall-type split-gate EEPROM memory cell of the prior art.
Figure 2:
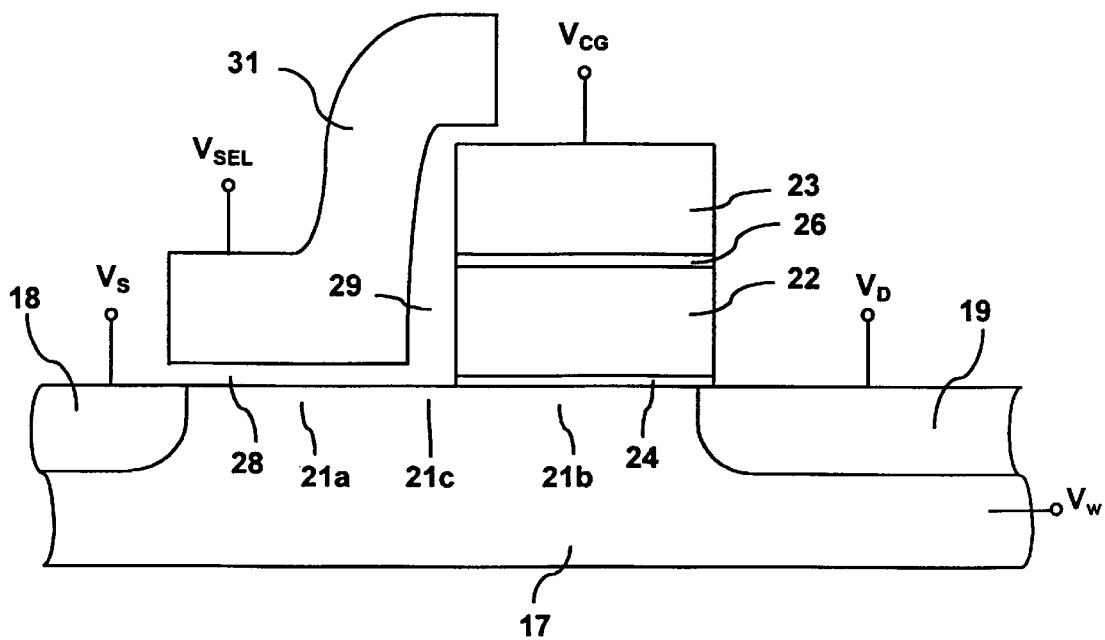
FIG. 2 is a cross sectional view of a split-gate flash EEPROM memory cell of the prior art.
Figure 3:
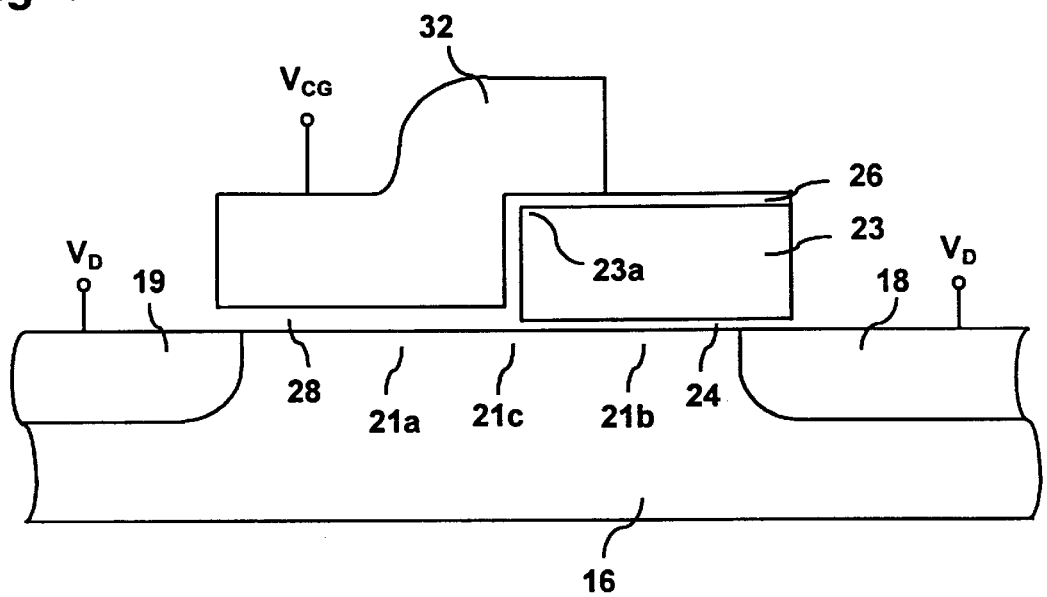
FIG. 3 is a cross sectional view of another split-gate flash memory cell of the prior art.
Figure 4A:
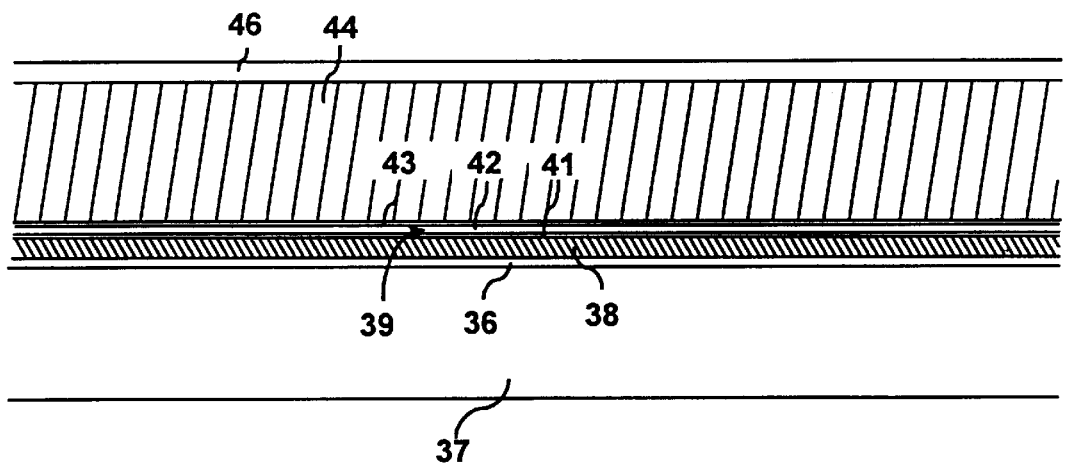
FIGS. 4A–4G are schematic cross sectional views illustrating the steps in one embodiment of a process for fabricating a flash memory cell with self-aligned floating, control, and select gates.

As illustrated in FIG. 4A, an oxide layer 36 having a thickness on the order of 70–250 Å is thermally grown on a monocrystalline silicon substrate 37 for use as a gate oxide or a tunnel oxide. The substrate can be in the form of a P-well or P-substrate material. A layer 38 of polysilicon or amorphous silicon (the poly-1 layer) is deposited on the oxide layer for use as a floating gate, and a dielectric film 39 is formed on the silicon layer. The poly-1 layer has a thickness on the order of 100–1000 Å, which is substantially thinner than the floating gates in prior art devices which are typically about 2000 Å thick. The poly-1 layer is preferably doped with phosphorus, arsenic or boron to a level on the order of $10^{17}$ to $10^{20}$ per cm$^3$. The doping can be done in-situ during deposition of the silicon or by ion implantation directly into the silicon or through the dielectric film.

The dielectric film can be either a pure oxide or a combination of oxide, nitride and oxide (ONO), and in the embodiment illustrated, it consists of a lower oxide layer 41 having a thickness on the order of 30–100 Å, a central nitride layer 42 having a thickness on the order of 60–300 Å, and an upper oxide layer 43 having a thickness on the order of 30–100 Å.

A layer 44 of polysilicon (the poly-2 layer) is deposited on the dielectric film for use as a control gate. This layer has a thickness on the order of 1500–3500 Å, and is doped with phosphorous, arsenic or boron to a level on the order of $10^{20}$ to $10^{21}$ per cm$^3$. A layer 46 of CVD oxide or nitride is then deposited on the poly-2 layer to a thickness on the order of 300–1000 Å. During subsequent dry etching steps, the layer of oxide or nitride serves as a mask to prevent the poly-2 in the control gate area from being etched away.

Figure 4B:
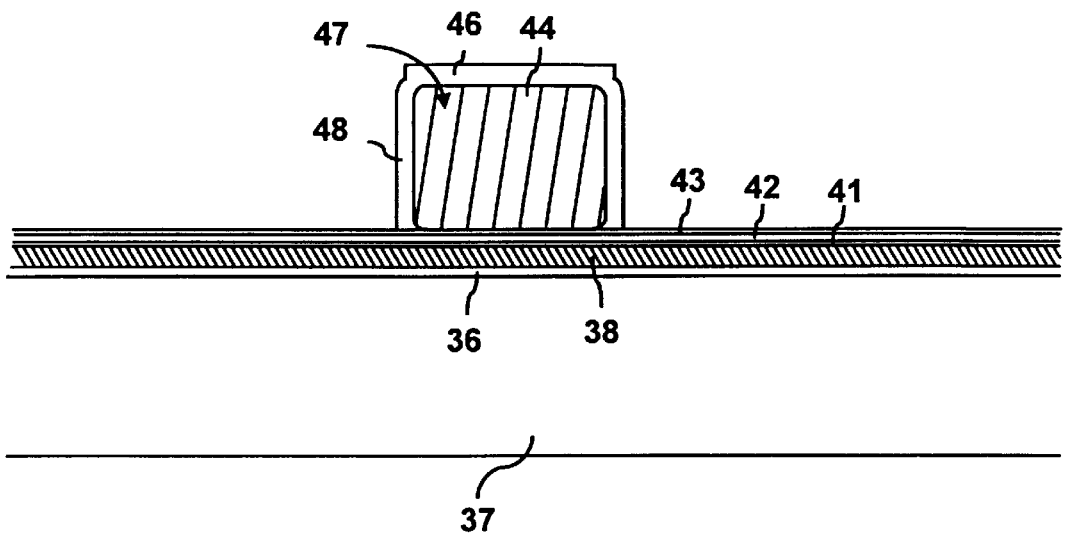

A photolithographic mask (not shown) is formed over layer 46 to simultaneously define both the control gate and the floating gate, and the unmasked portions of that layer and the poly-2 layer are removed in an anisotropic dry etch, leaving only the portion of the poly-2 which forms the control gate 47, as illustrated in FIG. 4B. The photoresist is then stripped away, and an oxide layer 48 is thermally grown on the side wall of the polysilicon to a thickness on the order of 100–600 Å.

During the thermal oxidation process, the corners of the polysilicon become rounded because the oxidation rate for the silicon is faster next to the interfaces with oxide layers 43, 46. This rounding enhances the performance of the memory cell during erase cycles by eliminating the sharp corners of the polysilicon and thus minimizing the leakage current between the control gate and the select gate.

Figure 4C:
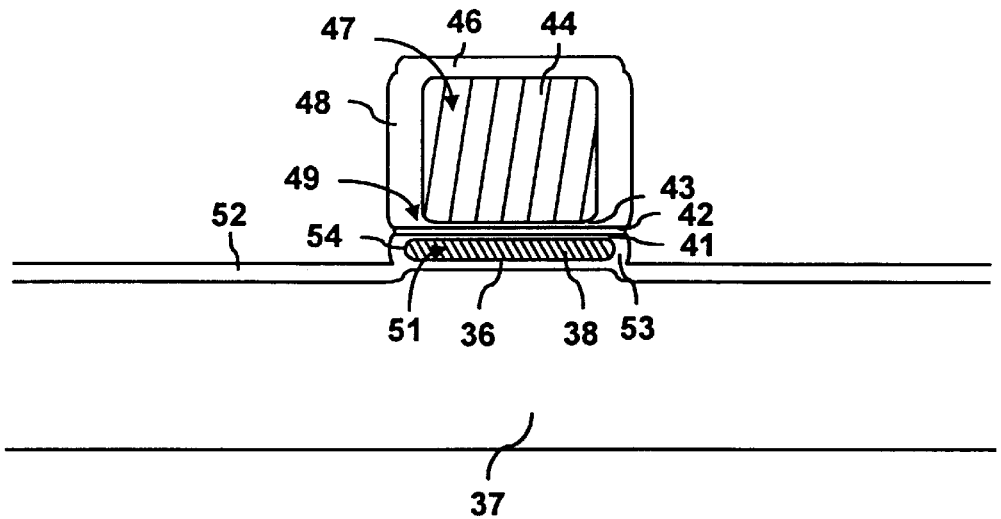

Referring now to FIG. 4C, using the control gate and oxide and/or nitride on it as a mask, the inter-poly dielectric and the poly-1 are etched in an anisotropic dry etch to form the inter-poly dielectric 49 and the floating gate 51.

Thereafter, in a thermal oxidation step, a select gate oxide 52 if formed on the substrate, an oxide layer 53 is formed on the exposed edge of the floating gate, and the oxide layer 48 on the side wall of the control gate is made thicker. Oxide layer 53 is used as a tunneling oxide, and preferably has a thickness on the order of 50–300 Å. If desired, a thin layer of CVD oxide (about 50–200 Å) can be deposited on the thermal oxide to improve the quality of the oxide films and reduce disturbances between the select gate and the floating gate.

During the thermal oxidation process, the edge portion or side wall 54 of the floating gate becomes rounded because the oxidation rate for the poly-1 is faster near the interfaces with the oxide layers above and below it. This rounded curvature provides an electric field enhancement which makes it much easier for electrons to tunnel out of the floating gate through this area. In addition, it eliminates the localized trapping effect which occurs in a tunnel oxide near square corners of poly-1. This enhances performance of the memory cell during both the program cycle and the erase cycle.

Figure 4D:
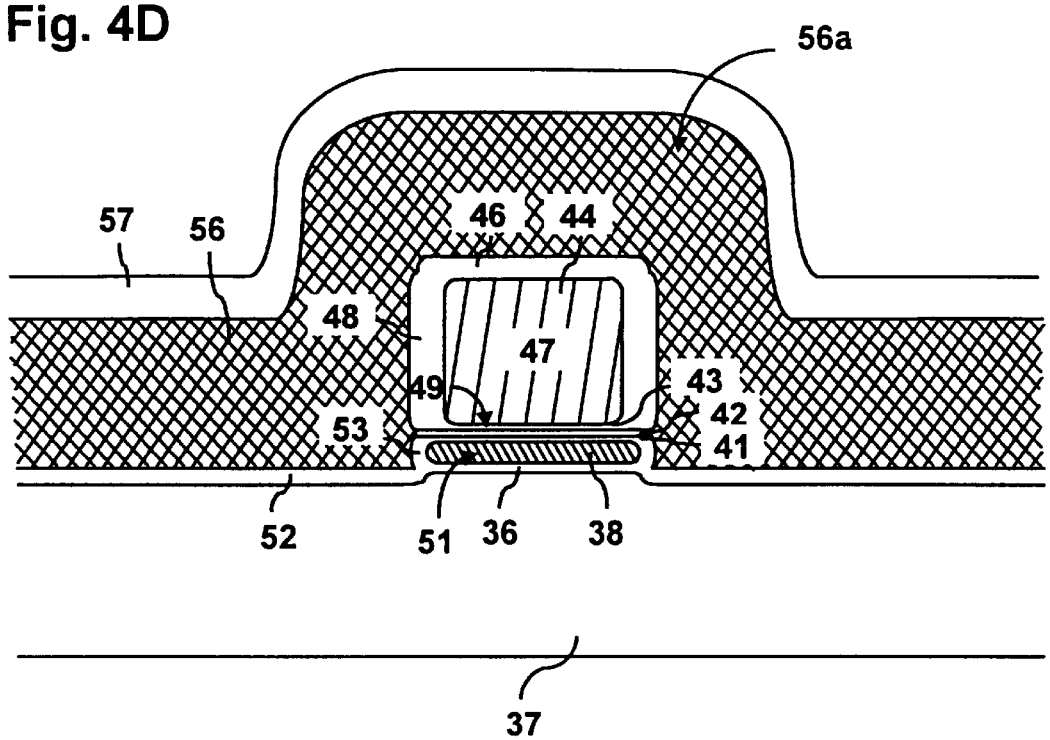

A polysilicon layer (poly-3) 56 is then deposited over the oxide layers, and a nitride or oxide layer 57 is deposited on the poly-3 layer, as illustrated in FIG. 4D. During this deposition, the step formed by the control gate, the layer of oxide or nitride on it, the inter-poly dielectric and the floating gate causes a corresponding step 56a to be formed in the poly-3 layer. That step is utilized in subsequent removal of portions of the poly-3 layer to form the select gate, and for that reason, the thickness of the poly-3 layer should be less than the height of the step over which it is formed. In one present embodiment, the poly-3 layer has a thickness on the order of 2000–4000 Å, and nitride or oxide layer 57 has a thickness on the order of 200–1500 Å.

Figure 4E:
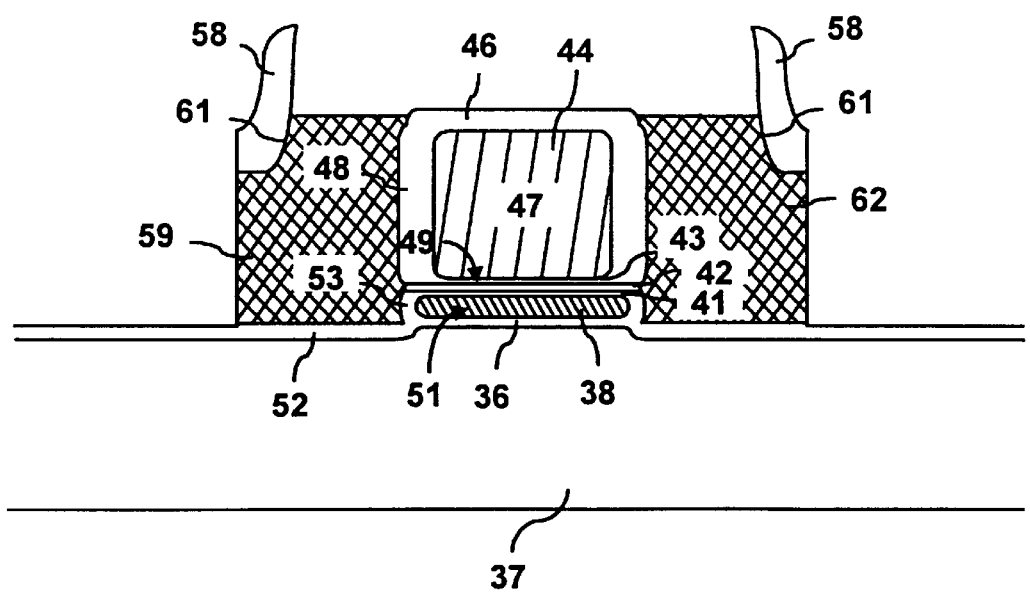

The nitride or oxide is removed from the flat areas of the poly-3 layer by anisotropic dry etching, leaving only the vertically extending portion 58, as shown in FIG. 4E. The poly-3 layer is also etched anisotropically to form the select gate 59. Since the poly-3 layer is thinner than the step formed by the control gate and the other elements beneath it, etching to the thickness of the poly-3 layer removes all of the poly-3 above the control gate and all of the poly-3 outside the area where the step 56a was formed.

The nitride or oxide in region 58 protects the shoulder 61 of the poly-3 from being etched away. It also provides control over the channel length of the select gate and reduces the sheet resistance of the select gate. Thus, for example, by making the nitride or oxide layer thicker, the shoulder can be made wider, resulting in a longer channel length. The thickness of the poly-3 layer can also be used to adjust the width and height of the select gate, with thicker poly-3 resulting in a thicker and wider gate. Lower sheet resistance reduces the loading effect of the select gate and results in faster performance for the memory cell.

Figure 4F:
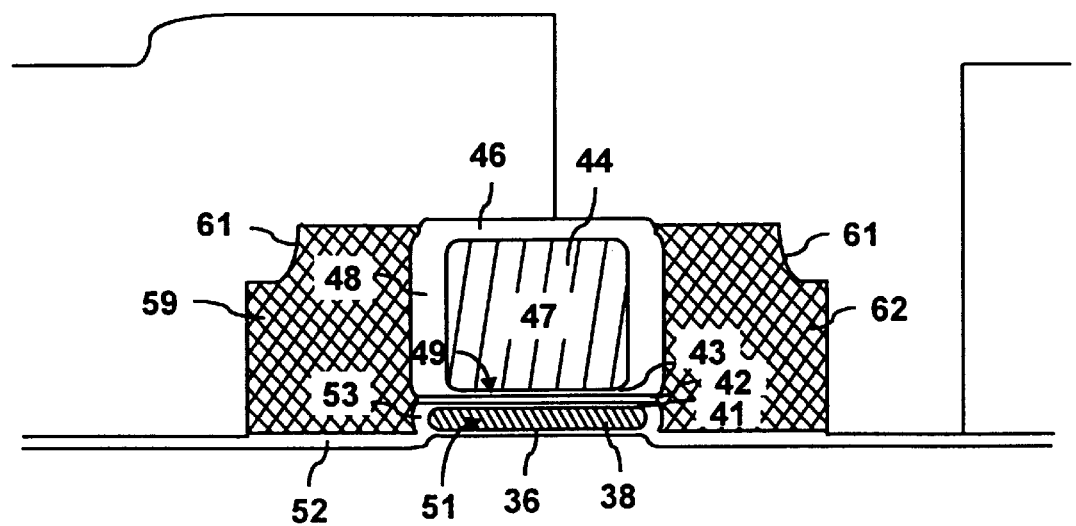

The remaining nitride or oxide is stripped away, as illustrated in FIG. 4F, and after photolithographic masking, the poly-3 spacer 62 on the side of the control gate opposite the select gate is etched away.

Figure 4G:
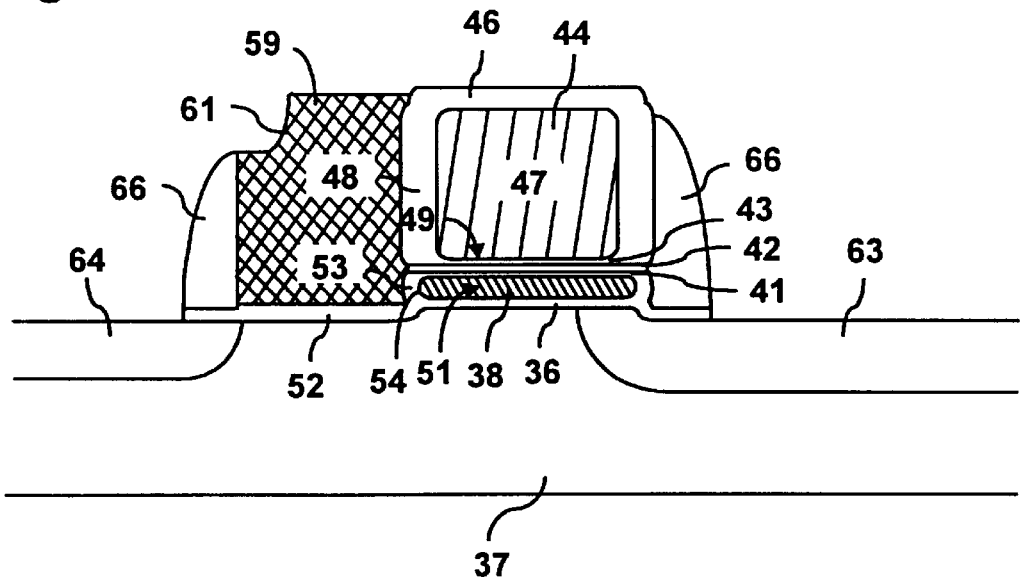

As illustrated in FIG. 4G, source 63 and drain 64 are now formed in the substrate, and oxide spacers 66 are formed to the side of the select gate 61 and control gate 47. Both the source and the drain are heavily doped with an N-type material such as phosphorus or arsenic, and the source is made with a deeper junction than the drain in view of the high voltage which will be applied across it during the program operation. The erase path of this memory cell is from the rounded curvature of the side wall 54 of the floating gate to the select gate. Because of the relatively thin floating gate and the rounded curvature of the side wall, the coupling ratio between the control gate and the floating gate can be made large, and electron tunneling is more efficient due to enhancement of the local electric field around the curvature of the side wall.

By using the control gate as a mask, the floating gate is automatically self-aligned with the control gate. The select gate is likewise completely self-aligned with respect to the floating gate and the control gate, and the select gate can have a small sheet resistance and better performance during cell operation.

Operation of the memory cell of FIG. 4G is as follow, with bias voltages applied to the four node terminals as set forth in Table 1.

TABLE 1

| Mode | Control Gate | Select Gate | Drain | Source |
| --- | --- | --- | --- | --- |
| Erase | −7.0 to −12.0 | 3.0 to 7.0 | Floating | Floating |
| Program | 7.0 to 10.0 | 1.5 to 3.0 | 0 | 4.0 to 8.0 |
| Read | 0 to 2.5 | 2.5 to 5.0 | 1.5 to 3.0 | 0 |

In the erase mode, Fowler-Nordheim tunneling causes electrons to migrate from the floating gate to the select gate, leaving the positive ions as the majority carrier inside the floating gate. The rounded curvature of the floating gate enhances the electric field effect, and the tunneling takes place at a lower applied voltage than it would with two flat surfaces on opposite sides of the tunneling oxide. The electric field enhancement also makes it possible to form a thicker tunnel oxide while still maintaining sufficient electron tunneling.

The coupling ratio from the control gate to the floating gate is about 70 to 80 percent in the erase mode, which means that about 70 to 80 percent of the control gate voltage is coupled to the floating gate. This causes most of the voltage difference between the control gate and the select gate to fall across the tunnel oxide surrounding the rounded side wall of the floating gate, which triggers Fowler-Nordheim tunneling with electrons tunneling from the floating gate to the select gate. As the floating gate becomes more positive, the threshold voltage of the memory cell decreases to a level of −5.0 to −1.0 volts. This results in an inversion layer of the channel under the floating gate when the control gate is biased at 0 to 2.5 volts. Therefore, the memory cell is in a conduction, or logic 1, state after an erasing.

In the program mode, electrons are injected into the floating gate, and the floating gate becomes negatively charged. With the control gate biased at 7.0 to 10 volts, the select gate biased at 1.5 to 3.0 volts, the drain biased at around 0 volts, and the source biased at 4.0 to 8.0 volts, most of the source-to-drain voltage falls across the mid-channel region between the select gate and the floating gate, which generates a high electric field in the mid-channel region. Moreover, since the floating gate is coupled to a high voltage by the voltages supplied from the source and the control gate, a high vertical electric field is established across the oxide between the mid-channel region and the floating gate.

When electrons flow from the drain to the source during programming, they are accelerated by the high field across the mid-channel region, and some of them become heated. Being accelerated by the vertical electric field, some of the hot electrons can surpass the oxide barrier height of about 3.1 eV and inject into the floating gate. When the programming is finished, the floating gate becomes negatively charged, and the threshold voltage of the memory cell increases to a level of about 3.0 to 6.0 volts. This turns off the channel under the floating gate, with the control gate biased at 0 to 2.5 volts. Thus, the memory cell is in a non-conductive, or logic 0, state after programming.

In the read mode, the control gate is biased at 0 to 2.5 volts, the source is biased at 0 volts, the drain is biased at 1.5 to 3.0 volts, and the select gate is biased at 2.5 to 5.0 volts. When the memory cell is in the erase state, the read shows a conduction state (logic 1) because both the floating gate and the select gate channels are turned on. When the memory cell is in a program state, the read shows a non-conduction state (logic 0) because the floating gate channel is turned off.

Figure 5:
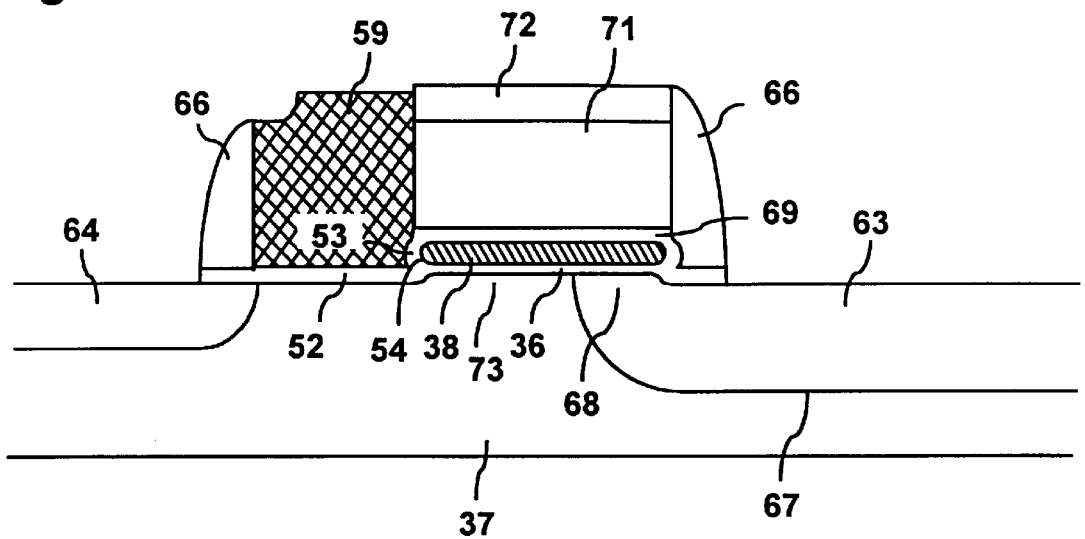
FIGS. 5 is a cross sectional view of an embodiment of a flash memory cell which has self-aligned floating and select gates, but no control gate.

The embodiment of FIG. 5 is generally similar to the embodiment of FIG. 4G, and like reference numerals designate corresponding elements in the two embodiments. In the embodiment of FIG. 5, however, there are only two silicon layers, and the memory cell has only a floating gate 51 and a select gate 59; there is no control gate. This embodiment also has a deeper source junction 67 and a wider area of source overlap 68 under the floating gate, which serve the function of the control gate in providing the voltage which is coupled to the floating gate.

The ONO film on the poly-1 is also thicker in this embodiment, with a bottom oxide layer 69 which is on the order of 50–300 Å thick, a nitride layer 71 which is on the order of 1000–2000 Å thick, and a top oxide layer 72 which is on the order of 200–1000 Å thick. This thick film is etched anisotropically to serve as a mask in the formation of the floating gate and to provide a step which is used in the formation of the select gate, just as the control gate is utilized in the embodiment of FIGS. 4A–4G. Alternatively,if desired, the ONO layer can be replaced with an ON film having a bottom oxide layer on the order of 50–300Å thick and a nitride layer on the order of 1000–3000 Å thick. The erase path of this memory cell is from the rounded curvature of the side wall 54 of the floating gate to the select gate.

Operation of the memory cell of FIG. 5 is as follows, with bias voltages applied to the node terminals as set forth in Table 2a.

TABLE 2a

| Mode | Select Gate | Drain | Source |
| --- | --- | --- | --- |
| Erase | 12 to 15.0 | Floating | 0 |
| Program | 1.5 to 3.0 | 0 | 10.0 to 13.0 |
| Read | 2.5 to 5.0 | 1.5 to 3.0 | 0 |

In the erase mode, Fowler-Nordheim tunneling causes electrons to tunnel from the floating gate to the select gate. A positive voltage on the order of 12 to 15 volts is applied to the select gate, the drain node is kept floating, and the source node is biased at 0 volts. With a coupling ratio from the source node on the order of 70 to 85 percent, for example, about 70 to 85 percent of the source voltage is coupled to the floating gate. With the combination of the overlapping source 68 and channel regions 73, there is more voltage coupled from the source node to the floating gate. This results in a larger coupling ratio, e.g., about 80 to 90 percent in this example. Therefore, most of the voltage difference between the select gate and the source is located across the tunnel oxide surrounding the rounded side wall 54 of the floating gate, triggering Fowler-Nordheim tunneling and forcing electrons to tunnel from the floating gate to the select gate. After the erase operation is finished, the floating gate becomes positively charged, and the threshold voltage of the memory cell decreases to the level of −5.0 to −1 volt. Thus, an inversion layer can be formed in the channel under the floating gate even though there is no control gate above the floating gate. The memory cell is now in its conduction state (logic 1).

In the program mode, the select gate is biased at 1.5 to 3.0 volts, the drain is biased at around 0 volts, and the source is biased at 10 to 13 volts. This bias condition can turn on the channel under the select gate and the channel under the floating gate. Therefore, most of the source-to-drain voltage is set across the mid-channel region between the select gate and the floating gate. The floating gate is coupled to a high voltage from the source under the floating gate, and thus a high vertical electric field is established across the oxide between the mid-channel region and the floating gate. The combined high electric fields around the mid-channel region generates hot electrons and forces some of them to be injected into floating gate. After programming is finished, the floating gate becomes negatively charged, and the threshold voltage of the memory cell increases to a level on the order of 3.0 to 6.0 volts. The channel under the floating gate is now turned off, and the memory cell is in a nonconductive state (logic 0).

In the read mode, the source is biased at 0 volts, the drain is biased at 1.5 to 3.0 volts, and the select gate is biased at 2.5 to 5.0 volts. When the memory cell is in the erase state, the read shows a conduction state because both the floating gate and the select gate channels are turned on. When the memory cell is in the program state, the read shows a nonconductive state because the floating gate channel is turned off.

Alternatively, in the embodiment of FIG. 5, the memory cell can be fabricated in a P-well surrounded by an N-well or an N-type substrate.

In this case, the bias voltages applied to the terminal nodes of the memory cell are set forth in Table 2b.

TABLE 2b

| Mode | Select Gate | Drain | Source | P-Well |
| --- | --- | --- | --- | --- |
| Erase | 6.0 to 9.0 | Floating | −9 to −6 | −9 to −6 |
| Program | 1.5 to 3.0 | 0 | 10.0 to 13.0 | Floating |
| Read | 2.5 to 5.0 | 1.5 to 3.0 | 0 | Floating |

Operation of this memory cell is otherwise the same as described above for the embodiment of FIG. 5, with the channel and source regions beneath the floating gate providing an even higher coupling ratio for the floating gate.

Figure 6:
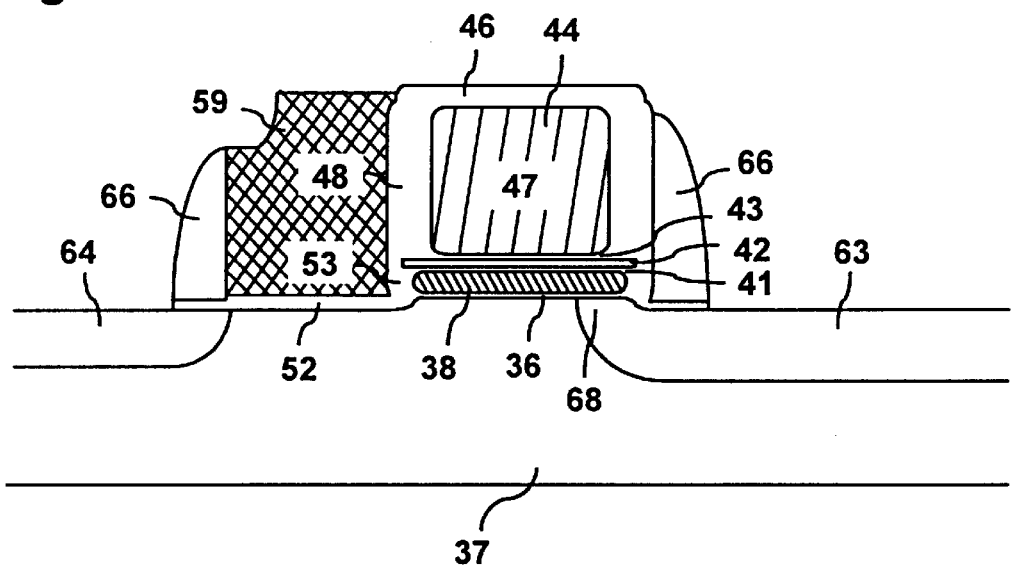
FIGS. 6 is a cross sectional view of another embodiment of a flash memory cell which has self-aligned floating, control and select gates.

The embodiment of FIG. 6 is also generally similar to the embodiment of FIG. 4G, and like reference numerals designate corresponding elements in these two embodiments as well. In the embodiment of FIG. 6, however, oxide layer 36 is on the order of 70–1 20 Å thick, and is used as the tunnel oxide for the erase operation. The oxide 53 surrounding the rounded side wall 54 of the floating gate is not used as a tunneling oxide in this embodiment, and can be made thicker, e.g., up to about 200–1000 Å. A poly-2 layer 44 is included to form a control gate 47, and the inter- poly dielectric is preferably an ONO film, as in the embodiment of FIG. 4G. In this embodiment, the tunneling window is the area of overlap 68 of the source beneath the floating gate, and the erase path is from the floating gate to the overlapping portion of the source.

Operation of the memory cell of FIG. 6 is as follows, with bias voltages applied to the four node terminals as set forth in Table 3.

TABLE 3

| Mode | Control Gate | Select Gate | Drain | Source |
|---|---|---|---|---|
| Erase | −7.0 to −12.0 | Floating | Floating | 3.0 to 7.0 |
| Program | 7.0 to 10.0 | 1.5 to 3.0 | 0 | 4.0 to 8.0 |
| Read | 0 to 2.5 | 2.5 to 5.0 | 1.5 to 3.0 | 0 |

In the erase mode, electrons inside the floating gate are forced to tunnel from the floating gate to the overlapping source region 68 by Fowler-Nordheim tunneling. During the erase operation, a high electric field (>10MV/cm) is established across the tunnel oxide 36 that was thermally grown on the silicon substrate. That is achieved by applying a negative voltage on the order of −7.0 to −12.0 to the control gate and a positive voltage on the order of 3.0 to 7.0 volts to the source node. The drain and select gate nodes are kept floating, and the coupling ratio can, for example, be on the order of 70 to 85 percent. Therefore, most of the voltage difference between the control gate and the source is located across the tunnel oxide, resulting in Fowler-Nordheim tunneling and movement of electrons from the floating gate to the overlapping source region. After the erasing operation is finished, the floating gate is positively charged, and the threshold voltage of the memory cell drops to a level on the order of −5.0 to −1.0 volts. This forms an inversion layer in the channel under the floating gate when the control gate is biased at 0 to 2.5 volts. Therefore, the memory cell is in a conduction state (logic 1) after an erase operation.

The program mode is similar to that of the embodiment of FIG. 4G. However, the values of the bias voltages may be vary due to the different thickness of oxide 36 and oxide 53. After the programming is finished, the floating gate becomes negatively charged, and the threshold voltage of the memory cell increases to a level on the order of 3.0 to 6.0 volts. This turns off the channel under the floating gate when the control gate is biased to 0 to 2.5 volts. Therefore, the memory cell is in a nonconducting state (logic 0) after programming.

As illustrated in FIGS. 7–10, the process of this invention is advantageously combined with the process disclosed in Ser. No. 09/255,360, filed Feb. 23, 1999, to provide a memory cell in which the edges of the floating gate are also aligned with the edges of the active area. The disclosure of that application is incorporated herein by reference.

Figure 7:
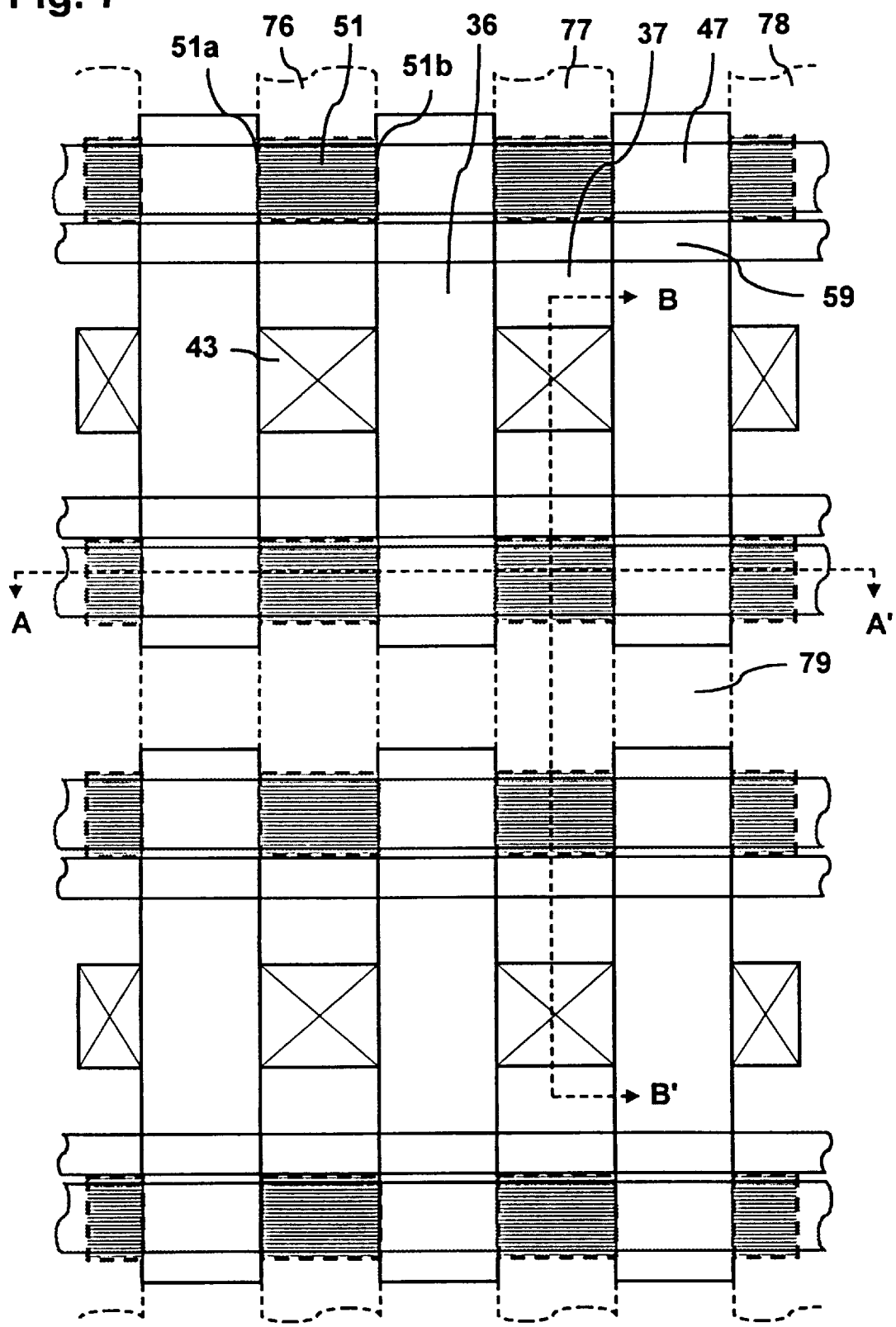
FIGS. 7–10 are top plan views of memory cell arrays utilizing the memory cells of FIGS. 4G, 5 and 6.
Figure 8:
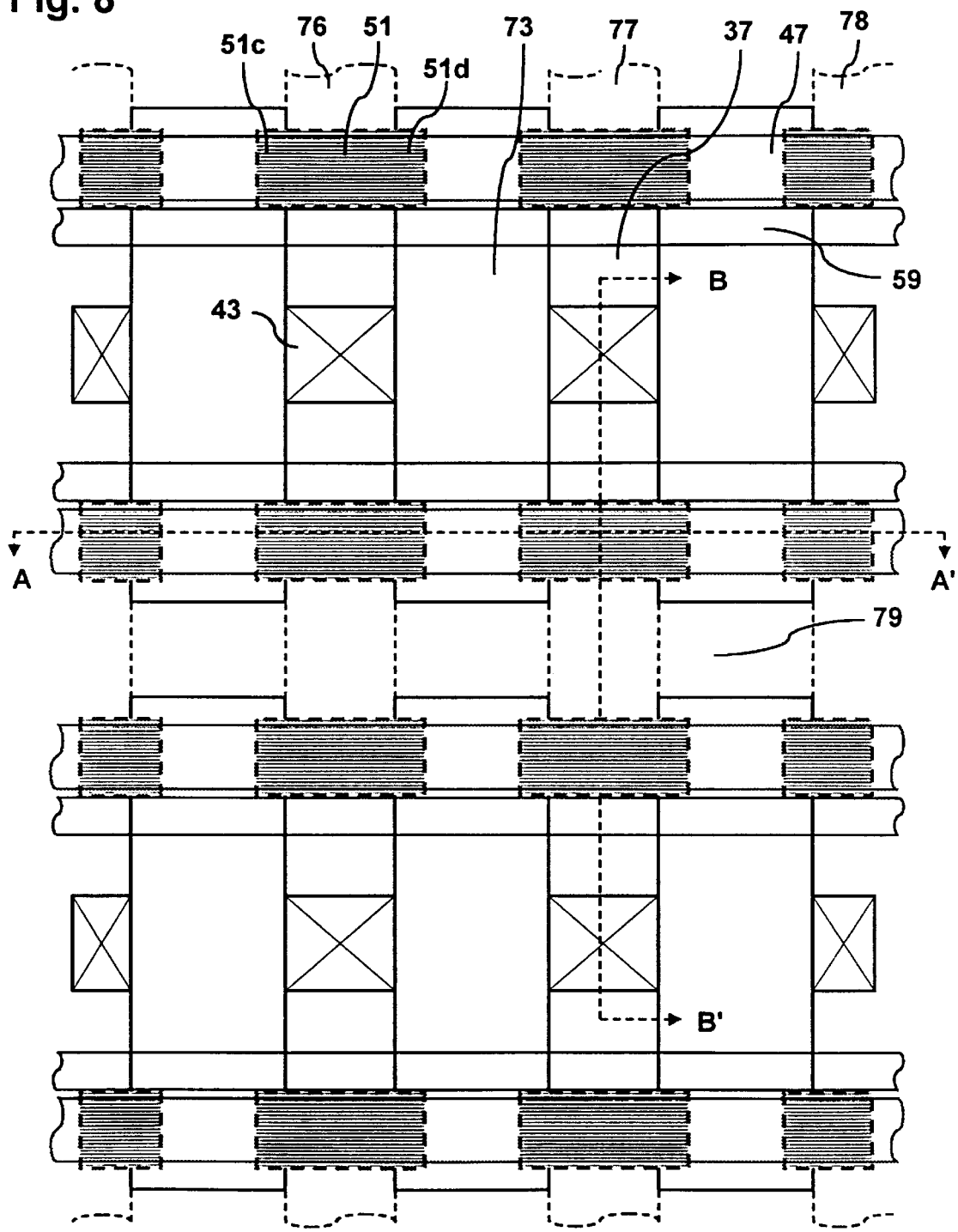

FIGS. 7 and 8 illustrate NOR-type memory cell arrays of memory cells of the type illustrated in FIGS. 4G and 6 with and without floating gates which are self-aligned with the edges of the active areas. In the embodiment of FIG. 7, the edges 51a, 51b of floating gate 51 are aligned with the edges of active area of substrate 37, whereas in the embodiment of FIG. 8, the floating gate has end caps 5c, 51d which extend over isolation oxide regions 73. Without self-alignment of the edges of the floating gate with the edges of the active region, these end caps are necessary in order to prevent short channeling or punch through due to pattern shifting or corner rounding during formation of the floating gates.

Figure 11:
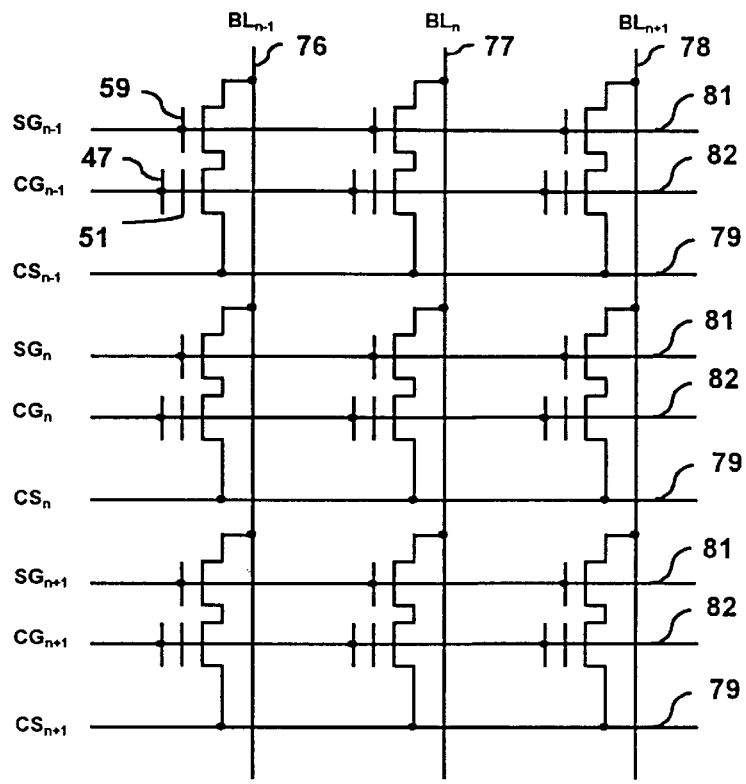
FIGS. 11 and 12 are circuit diagrams of the memory cell arrays of FIGS. 7–10.

A circuit diagram for the memory cell arrays of FIGS. 7 and 8 is shown in FIG. 11. All of the memory cells in a given column have their drains connected to a bit line $BL_{n-1}$, $BL_n$, $BL_{n+1}$, etc., which is typically a metal line 76–78 that crosses over the active area, and all of the cells in a given row are connected to a source line 79, which is typically an N+ diffusion layer in the silicon substrate 37. Adjacent ones of the bit lines are isolated from each by a dielectric film (not shown). All of the select gates 59 in a given row are connected together by a select gate line 81, and all of the control gates 47 in a given row are connected together by a control gate line 82. The select gate lines and the control gate lines are formed of the poly-3 and poly-2 layers, respectively.

Figure 9:
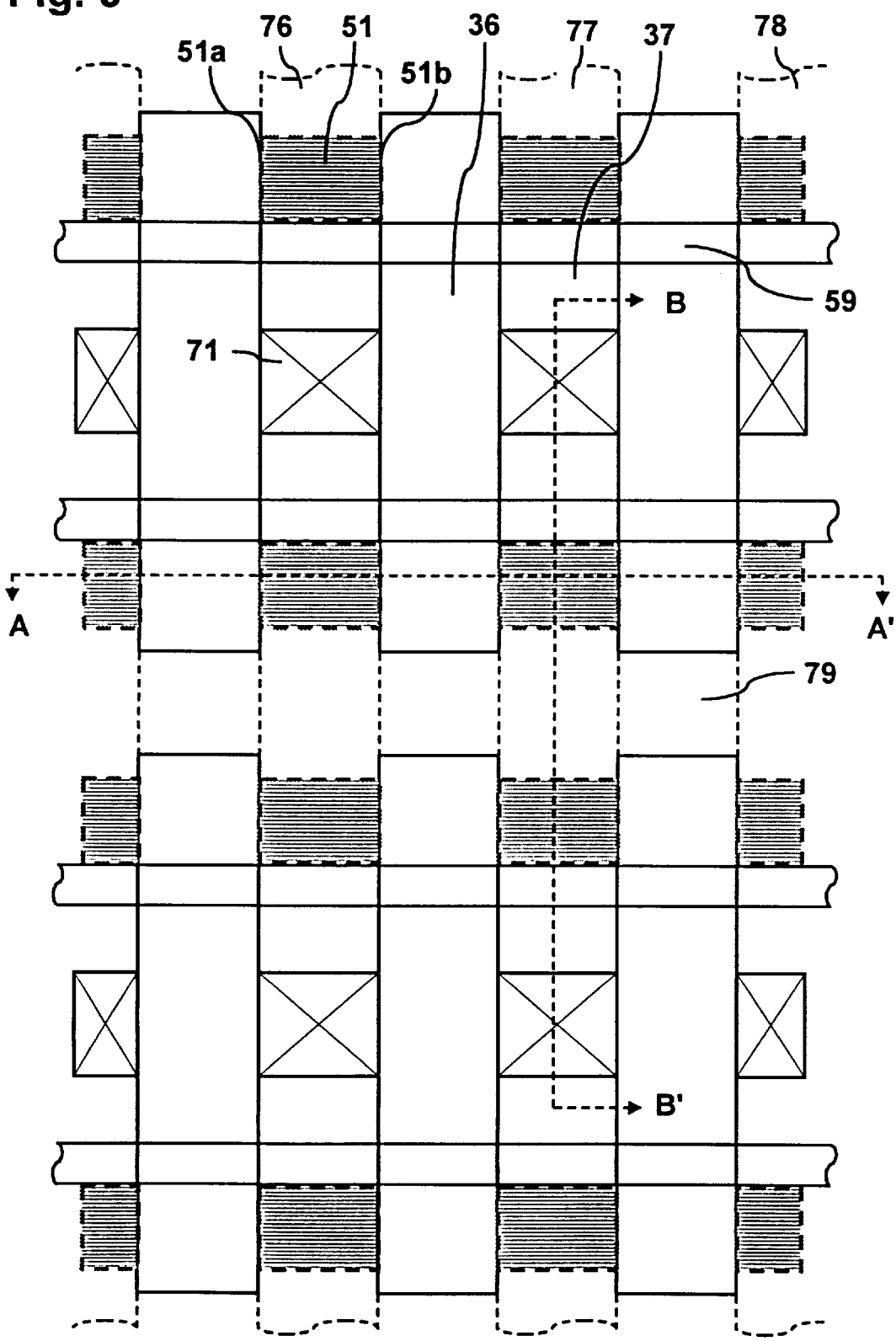
Figure 10:
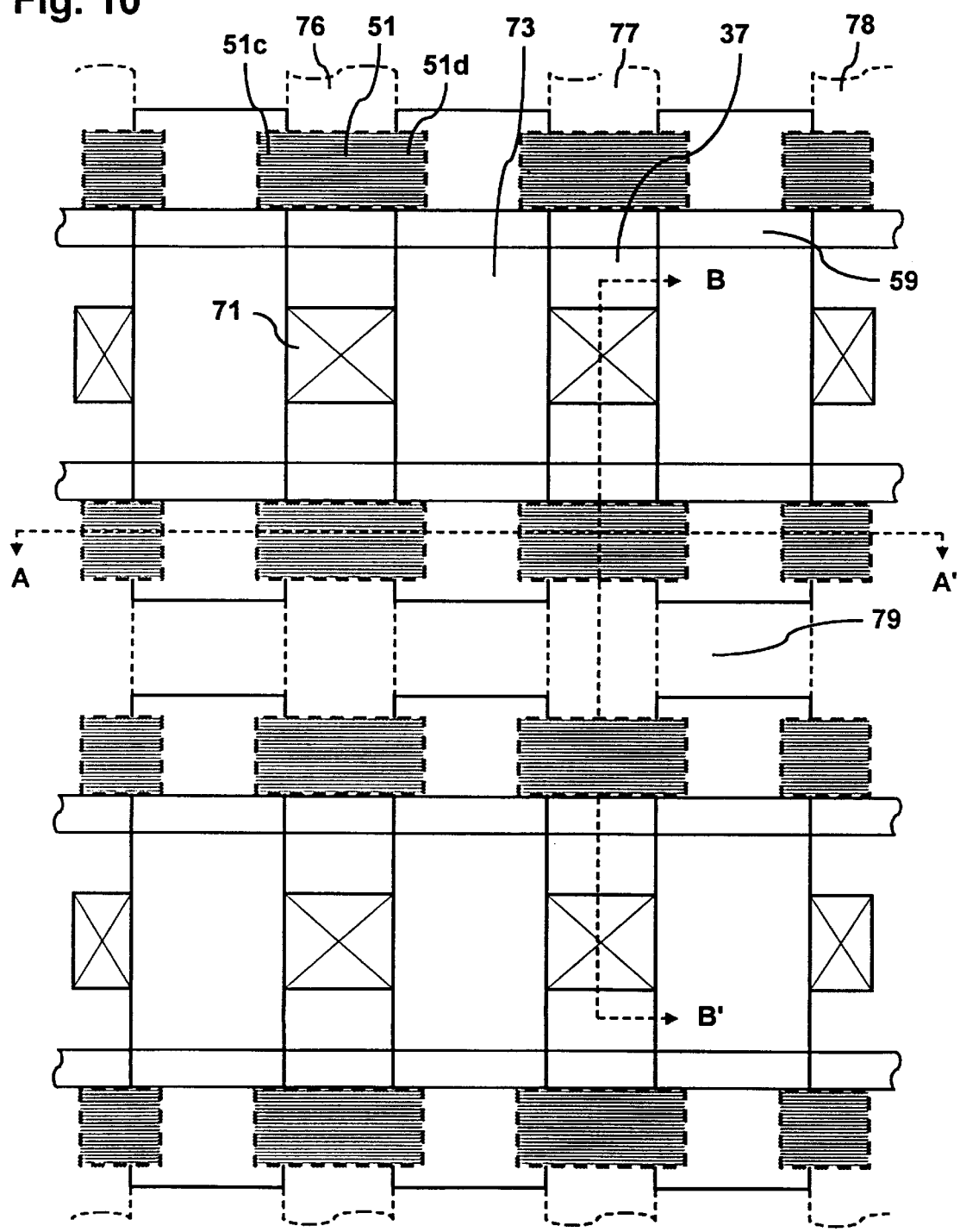

FIGS. 9 and 10 illustrate NOR-type memory cell arrays of memory cells of the type illustrated in FIG. 5 with and without floating gates which are self-aligned with the edges of the active areas. In the embodiment of FIG. 9, the edges 51a, 51b of floating gate 51 are aligned with the edges of active area of substrate 37, whereas in the embodiment of FIG. 10, the floating gate has end caps 51c, 51d which extend over isolation oxide regions 73. These embodiments are similar to the embodiments of FIGS. 7 and 8 except there are no control gates.

Figure 12:
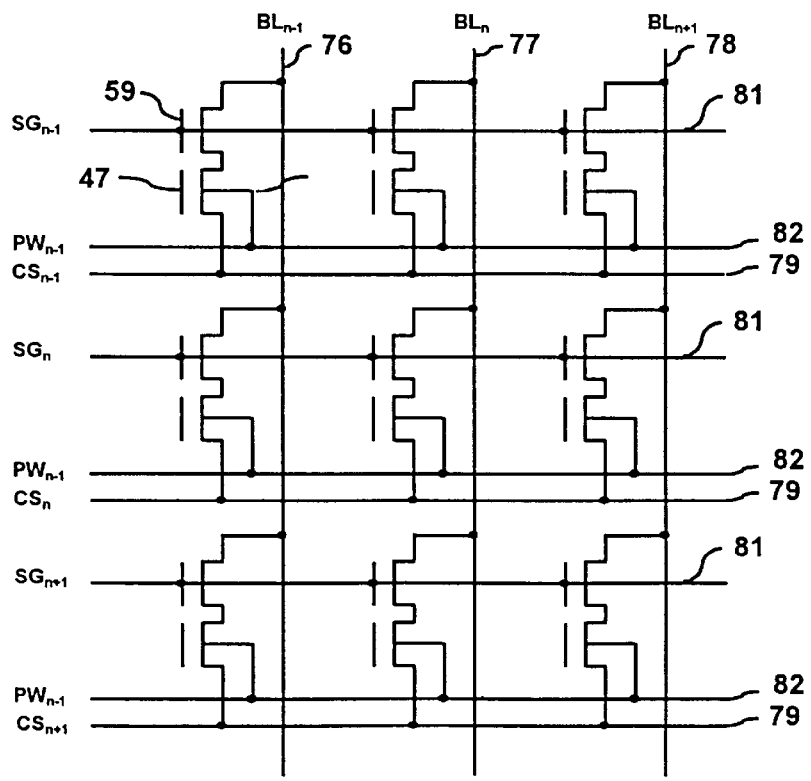

A circuit diagram for the memory cell arrays of FIGS. 9 and 10 is shown in FIG. 12. This circuit is similar to the circuit of FIG. 11 except there are no control gates.

The invention has a number of important features and advantages. The floating gate and the select gate are self-aligned both with respect to each other and with respect to the control gate. Being relatively thin, the floating gate can have a larger coupling ratio with the control gate, and it presents a smaller tunneling window when the side wall or edge of the gate is used as a source of electrons during erase operations. Moreover, the rounded side wall or edge of the floating gate enhances the local electric field around the curvature of the edge and provides more efficient tunneling of electrons during erase operations. This permits the tunnel oxide layer between the select gate and the floating gate to be made wider but still maintains a robust erase operation.

Since the select gate is formed from a layer of silicon which is deposited over a step created by the control gate or a thick dielectric layer, the height and width of the select gate can be controlled by making the step higher or shorter, by depositing a thicker layer of silicon, and by depositing a thicker or thinner layer or nitride or oxide above the silicon. The nitride or oxide protects the shoulder of the silicon step during etching to form the select gate. Consequently, the select gate can have a small sheet resistance, a small loading effect, and faster performance.

It is apparent from the foregoing that a new and improved semiconductor device and process have been provided. While only certain presently preferred embodiments have been described in detail, as will be apparent to those familiar with the art, certain changes and modifications can be made without departing from the scope of the invention as defined by the following claims.

What is claimed is:

1. In a memory cell: a substrate having an active area, an oxide layer formed on the substrate above the active area, a relatively thin floating gate having a side wall with a rounded curvature positioned above the oxide layer, a control gate which is substantially thicker than the floating gate positioned above and in vertical alignment with the floating gate, a dielectric film between the floating gate and the control gate, a select gate positioned to one side of the control gate and facing the side wall of the floating gate with the rounded curvature, a tunnel oxide between the select gate and the floating gate, and a tunneling path for the migration of electrons during erase operations extending from the side wall of the floating gate with the rounded curvature through the tunnel oxide to the select gate.

2. The memory cell of claim 1 wherein the floating gate has a thickness on the order of 100–1000 Å, and the control gate has a thickness on the order of 1500–3500 Å.

3. In a memory cell: a substrate having an active area, an oxide layer formed on the substrate above the active area, a relatively thin floating gate having a side wall with a rounded curvature positioned above the oxide layer, a dielectric film which is substantially thicker than the floating gate positioned above and in vertical alignment with the floating gate, a select gate positioned to one side of the control gate and facing the side wall of the floating gate with the rounded curvature, a tunnel oxide between the select gate and the floating gate, and a tunneling path for the migration of electrons during erase operations extending from the side wall of the floating gate with the rounded curvature through the tunnel oxide to the select gate.

4. The memory cell of claim 3 wherein the dielectric film comprises a bottom oxide layer which is on the order of 50–300 Å thick, a nitride layer which is on the order of 1000–2000 Å thick, and a top oxide layer which is on the order of 200–1000 Å thick.

5. The memory cell of claim 3 wherein the dielectric film comprises an oxide layer which is on the order of 50–300 Å thick and a nitride layer which is on the order of 1000–3000Å thick.

6. In a memory cell: a substrate having an active area, a relatively thin gate oxide layer formed on the substrate above the active area, a relatively thin floating gate having a side wall with a rounded curvature positioned above the oxide layer, a control gate which is substantially thicker than the floating gate positioned above and in vertical alignment with the floating gate, a dielectric film between the floating gate and the control gate, a select gate positioned to one side of the control gate and facing the side wall of the floating gate with the rounded curvature, a relatively thick oxide layer between the select gate and the floating gate, a source region formed in the substrate with a portion of the source region overlapping beneath the floating gate, and a tunneling path for the migration of electrons during erase operations extending from the floating gate through the gate oxide layer to the overlapping portion of the source region.

7. The memory cell of claim 6 wherein the gate oxide layer has a thickness on the order of 70–120 Å, and the oxide layer between the select gate and the floating gate has a thickness on the order of 200–1000 Å.

* * * * *